United States Patent [19]

Meulenberg, Jr.

[11] 4,133,699
[45] Jan. 9, 1979

[54] SHAPED EDGE SOLAR CELL COVERSLIDE

[75] Inventor: Andrew Meulenberg, Jr., Gaithersburg, Md.

[73] Assignee: Communications Satellite Corporation, Washington, D.C.

[21] Appl. No.: 900,365

[22] Filed: Apr. 26, 1978

[51] Int. Cl.² ............................................. H01L 31/04
[52] U.S. Cl. .................................................. 136/89 CC
[58] Field of Search ........................ 136/89 CC, 89 PC

[56] References Cited

U.S. PATENT DOCUMENTS

| | | | |
|---|---|---|---|
| 2,206,196 | 7/1940 | Kubitzek | 136/89 X |
| 2,875,308 | 2/1959 | Tarbes | 201/63 |
| 2,904,612 | 9/1959 | Regnier | 136/89 |
| 2,964,636 | 12/1960 | Cary | 250/211 |
| 3,532,551 | 10/1970 | Webb | 136/89 |
| 3,615,853 | 10/1971 | Paine | 136/89 |
| 3,758,348 | 9/1973 | Whigham et al. | 148/175 |
| 3,778,684 | 12/1973 | Fischer et al. | 317/234 R |
| 3,844,843 | 10/1974 | Kay et al. | 136/206 |
| 3,888,697 | 6/1975 | Bogus et al. | 136/89 |
| 3,971,672 | 7/1976 | Lampkin | 136/89 |
| 3,990,100 | 11/1976 | Mamine et al. | 357/30 |
| 4,017,332 | 4/1977 | James | 136/89 PC |
| 4,053,327 | 10/1977 | Meulenberg, Jr. | 136/89 CC |

Primary Examiner—John H. Mack
Assistant Examiner—Aaron Weisstuch
Attorney, Agent, or Firm—Alan J. Kasper; John R. Berres; William M. Wannisky

[57] ABSTRACT

A solar cell coverslide, oversize to protect the cell against damage from radiation, is modified to have an edge portion configured to bend light incident on said edge portion inwardly toward an underlying solar cell. An adhesive fillet may be formed between the undersurface of the overhanging portion of the coverslide and the top edge of the solar cell to facilitate further the transmission of light striking the configured edge portion into the solar cell.

6 Claims, 5 Drawing Figures

SHAPED EDGE SOLAR CELL COVERSLIDE

FIELD OF THE INVENTION

The present invention relates to an oversize coverslide for use with light sensitive devices, particularly solar cells.

DESCRIPTION OF THE PRIOR ART

Normally, solar cell assemblies for extraterrestrial use comprise semiconductor wafers which are covered on their lightincident surface with transparent coverslides to protect the cell from radiation which can damage the semiconductor material. To protect the edges of the wafer from particulate radiation incident at angles other than 90°, prior art coverslides generally are oversize, by approximately 5 mil on a side for a 2×2 cm (798 × 798 mils) cell. When several cell assemblies are grouped into an array for use on spacecraft, spaces remain between the individual cells which are required for the electrical interconnection mechanisms and are designed to accomodate thermal stresses on the array. Typically, these spaces would be covered substantially by the oversize portion of the coverslide. Thus, a significant amount of light falling on the array falls perpendicularly on the inactive spaces between the cells, thereby resulting in a decrease of the array's overall ability to convert illumination into electrical energy. One example of the coverslide/solar assemblies used in such arrays is shown in U.S. Pat. No. 3,532,551, Solar Cell Including Second Surface Mirror, James E. Webb, Administrator of the National Aeronautics and Space Administration, issued Oct. 6, 1970. In that patent, a reflective coating is applied to the underside of the overhanging portion primarily to reduce heat absorption of the solar array rather than to direct light toward the cell.

Efforts have been made to modify the path of the light incident on the array and are described in the prior art. Although not described in terms of oversize coverslides, one technique is described in U.S. Pat. No. 2,964,636, Optically Immersed Photoconductive Cells, D. S. Cary, issued Dec. 13, 1960 which discloses a lens having a convex front surface to collect light and direct it toward a solar cell. The primary disadvantage of this technique is the additional weight and area of the lens structure when compared to a conventional coverslide. An additional disadvantage is the need for grinding and polishing of the entire lens surface. Another technique is described in U.S. Pat. No. 3,971,672, Light Diffuser for Photovoltaic Cell, Curtis M. Lampkin, issued July 27, 1976 which shows light diffusing areas located on the top surface of the cover glass which divert illumination radiation to the active areas of an underlying solar cell. One disadvantage with this technique is that it is only about 75% effective. That is, approximately 25% of the light striking the diffusion areas will still fall on the inactive areas between the solar cells. In the solar cell art even a one percent (1%) increase in overall performance can improve significantly the power level and, thus, the functional capability of a spacecraft.

SUMMARY OF THE INVENTION

The present invention describes a more effective coverslide for use with solar cells and other light sensitive devices. The effectiveness of a coverslide relates to the amount of light that strikes the coverslide which ultimately goes on to reach the underlying solar cell and consequently increases the current output of the solar cell. By configuring an edge or a portion thereof of a conventional oversize coverslide according to the teachings of this invention an additional 1 to 2% short circuit current output may be obtained. The effectiveness of the improved design is a function of three factors: the configuration of the shaped edge, the percentage oversize relative to the coverslide size, and the thickness of the coverslide.

It is an object of this invention to provide an oversize coverslide having improved effectiveness.

It is a further object of this invention to modify a conventional oversize coverslide to result in increased solar cell assembly effectiveness without a resultant increase in weight and/or array area.

It is yet a further object of this invention to provide a more effective oversize solar cell coverslide by configuring the edge of a standard oversize coverslide.

It is still a further object of this invention to provide a configured edge coverslide for use with a light collecting device to direct rays of light normal to the top surface of the coverslide but incident on said configured edge toward said light collecting device. Part of said light may be transmitted through a fillet formed of a light conducting adhesive positioned to complete the optical path of any such illumination.

These and other objects of the invention will be apparent from this specification and fron the drawings wherein like numerals are used throughout to identify like components.

DETAILED DESCRIPTION OF THE PREFERRED EMBODIMENTS

Figure 1A:
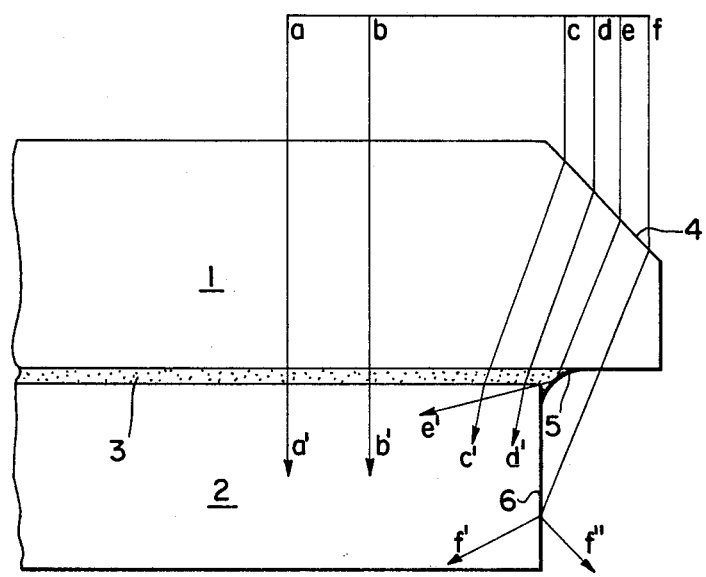
FIG. 1a is a cross-section fragment of a first embodiment showing an oversize coverslide and solar cell assembly wherein the coverslide has a simple bevelled edge positioned between the top surface of the coverslide and a side wall of the coverslide.

FIG. 1a shows the presently preferred first embodiment of the invention. In the Figure an oversize coverslide 1 is bonded to a solar cell 2 in a manner well known in the prior art. In the embodiment described, an adhesive 3 such as Dow Corning 93-500 is used to make the bond. Preferably, the adhesive chosen has an index of refraction close to that of the coverslide material. Coverslide bonding methods including adhesive and thermal techniques are well known to those having ordinary skill in the art and the choice of adhesive and- /or the manner of bonding per se is not crucial to the present invention.

Coverslides typically consist of fused silica or ceria-doped microsheet, although borosilicate glass is preferred for application in the absence of high ultra-violet radiation. Again, as in the case of the bonding, material selection is not crucial to the present invention and in fact would be readily apparent to one having ordinary skill in the art.

Typically, in order to increase the effectiveness of a solar cell array, a sun sensor and control mechanism are used to maintain the array perpendicular to the sun's rays. In the following description and analysis, it is assumed that the array is maintained perpendicular to the sun to demonstrate the improvement offered by the present invention in a typical spacecraft application. It is understood, however, that the present invention offers improved effectiveness even without sun sensing orientation of the array.

As depicted, parallel light rays, normal to the solar cell assembly impinge on both the top surface and bevelled edge portion of the coverslide 1. Optic paths a—a' and b—b' pass straight through the coverslide 1 and impinge on the solar cell 2. Optic paths c—c' and d—d' are seen to be incident on the bevelled edge portion 4 and refracted toward the solar cell 2. There is some additional refraction of the light path as it passes through the solar cell as can be seen in the Figure. Optic path e—e' also strikes the bevelled edge and is refracted toward the solar cell and is reflected from the interface of the fillet 5 surface and vacuum. The fillet 5 is formed of the same light transmissive adhesive material 3 used to bond the coverslide 1 to the solar cell 2. Transmission through this side wall 6 is enhanced by the high angle of incidence of the reflected light and the high index of refraction of the fillet as compared to that of vacuum. Optic path f—f' strikes the bevelled edge but beyond the fillet and consequently has a high probability of being reflected off the side wall 6 of the solar cell 2 (no antireflective coating exists on this side wall 6 face). consequently a portion of the illumination f' will be absorbed by the solar cell and a portion f'' will be reflected off its surface. As a result of the bevelled edge more illumination reaches the solar cell. It can be seen further that the device is made even more effective by the fillet 5 in that light incident on very low portions of the bevelled edge portion are more likely to be collected in the solar cell.

Figure 1B:
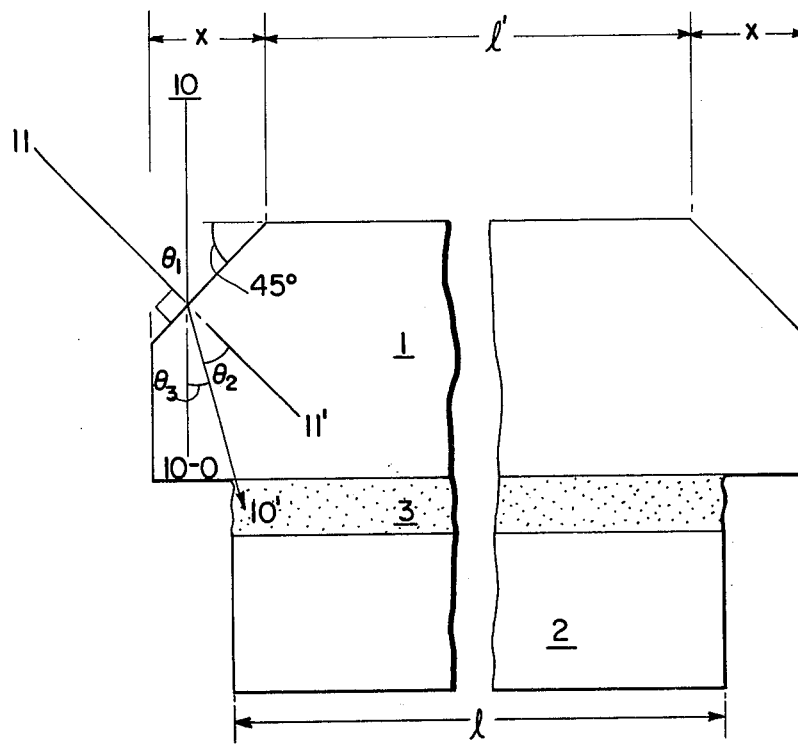
FIG. 1b is a diagrammatic representation showing the geometry of a simple 45° bevel edge oversize coverslide.

For purposes of illustration a diagrammatic representation of the optic geometry is given in FIG. 1b. There a bevel angle of 45° is chosen. Light 10—10' initially normal to the top surface of the coverslide impinges on the bevelled edge portion at some point and is refracted by the coverslide. A line 11—11' perpendicular to the bevelled edge is drawn through that same point. The angle between the incident portion of the light path 10—10' and 11—11' is identified as $\theta_1$. The angle betweeb the refracted portion of 10—10' and 11—11' is identified as $\theta_2$. The angle between the refracted portion of the light path 10—10' and a projection (10-0) of the incident light parth is identified as $\theta_3$. The relationship between the angles is given by $$n = \frac{\sin \theta_1}{\sin \theta_2} \quad (1)$$

where n is the index of refraction of the coverslide and $\theta_1$ is fixed by the initial determination of the bevel edge as shown in FIG. 1b. Here $\theta_1$ will be 45° because a 45° bevel angle was selected. Solving equation 1 for $\theta_2$ gives $$\theta_2 = \sin^{-1} \frac{(\sin \theta_1)}{n} \quad (2)$$

assuming a coverslide of a material having an index of 1.4 is used, it and the value of the sin of 45° may be substituted in equation (2) to give $$\theta_2 = \sin^{-1} \frac{0.707}{1.4} \quad (3)$$

Solving for $\theta_2$ yields:

$$\theta_2 = 29°$$

By simple geometrical relationship it is seen that $\theta_1 = \theta_2 + \theta_3 = 45°$, therefore here $\theta_3 = 16°$.

Accordingly, the light striking the bevelled-edge portion of the oversize coverslide which ordinarily would miss the active areas of a solar cell using a conventional coverslide is refracted 16° and impinges on the active area. If the thickness is not large compared to the overhang, some light striking the bevelled edge will not be as likely to pass into the solar cell unless a fillet 5 of adhesive 3 is deposited between the lower surface of the coverslide and the upper corner of the solar cell. Optic path e—e' in FIG. 1a illustrates the benefit of using the fillet. Alternatively of the coverslide is not sufficiently thick the angle of the bevel edge could be increased in order to bend the light more radically. The dimensions of the fillet 5 are not critical and would ordinarily be made as large as possible to provide a smooth curve fillet. The curve itself is formed by the natural meniscus properties of the adhesive 3. The fillet 5 may be formed simply by adding enough additional adhesive 3 at the junction of the coverslide and solar cell to form the fillet. By adding the correct amount of additional adhesive the fillet will have a smooth curve and will not flow over the coverslide edge or down the solar cell wall.

The effectiveness of the solar cell assembly is increased as a function of the amount of the additional light striking the cell given the same orientation of cell assembly and light. In terms of percentage, this effectiveness can be related to the increased surface area seen by the illumination normal to the solar cell assembly. For example, assuming a solar cell having an effective length (l) and width (w) is covered by an oversize coverslide which has an overhanging portion around the entire perimeter of the solar cell. The effective length and width are the dimensions of the coverslide defined by the size of the actual dimensions of the light-incident area of the solar cell. In other words the surface directly above the active area underlying solar cell would constitute the "effective area" of the coverslide since all illumination on this portion of the coverslide would reach the solar cell. In a conventional coverslide without a bevel edge, illumination normal to the top surface of the coverslide would see a solar cell through an effective area of:

$$A_{(conventional)} = l \cdot w \quad (4)$$

Any illumination incident on the overhanging portion would be transmitted through the coverslide and fall on an inactive area between the cells. The bevel edge of the present invention projects a dimension of x around the entire effective perimeter assuming that there is equal overhang in length and width. With the present invention, the illumination sees an "expanded area" of:

$$A_{(bevel\ edge)} = (l' + 2X) \cdot (w' + 2x) = l'w' + 2\,l'x + 2w'x + 4x^2 \quad (5)$$

Note, in this case l' and w' are the dimensions of the perimeter of the "plateau area" of the coverslide. Preferably, these dimensions should correspond fairly closely to the effective dimensions described previously since it is not beneficial to begin the bevel surface of the coverslide inside of the edges of the underlying solar cell, as illumination normal to this part of the coverslide would pass into the active area of the underlying solar cell. However, to provide for minor misalignment in assembly on the order of ±1 mil, the bevel may be extended somewhat. This has the effect of making l' slightly smaller than l. For purposes of this analysis, however, it is sufficiently accurate to assume that l and l' are equal. Accordingly, x represents a projected dimension outside the area defined by the perimeter of the solar cell. So, the percentage increase offered by this invention is given by $$E_{(increase)} = \left[\left(\frac{l'w' + 2\cdot l'x + 2w'x + 4x^2}{lw}\right) - 1\right] \cdot \frac{100\%}{1}$$

and $$E_{(increase)} \approx \frac{2x}{w} + \frac{2x}{l} \cdot 100\% \quad (6)$$

If typical dimensions are substituted in the equation (6) (such as l = 798 mils, w = 798 mils and x = 5 mils) the increased effectiveness of the present invention would be approximately 2.5% over a conventional coverslide assuming all light normal to the bevel edge portion is transmitted to the solar cell. predetermined The bevel portion can be machined not only on conventional flat coverslides but also on the sawtooth-surface coverslides. A sawtooth coverslide which may be adapted to incorporate the present invention is shown in U.S. Pat. No. 4,053,327, "Light Concentrating Solar Cell Cover", Andrew Meulenberg, Jr. issued Oct. 11, 1977. By using the teachings of the present invention a bevel edge portion of the proper angle can be cast with the sawtooth coverslide. The bevel edge portion can be manufactured around all or a portion of the coverslide perimeter. On a conventional flat coverslide the bevel edge can be fashioned by a simple edge grind and polish operation at the predetermined angle. In the case of the sawtooth type the bevel edge can be included in the basic design since this type of coverslide is poured or cast in a manner well known in the art.

Figure 2:
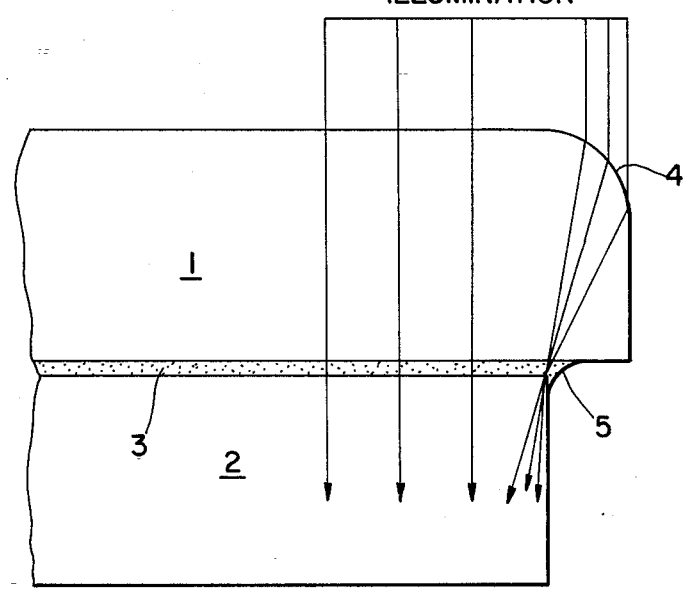
FIG. 2 is a cross section fragment of a second embodiment showing an oversize coverslide and solar cell assembly wherein the coverslide has a curved edge positioned between the top surface of the coverslide and the side wall of the coverslide.

FIG. 2 shows a coverslide having a curved-edge portion instead of a bevel edge. As depicted in the Figure it can be seen that light striking the curved portion will be directed toward the solar cell. The amount of curvature can be calculated from the endpoints. That is, the beginning point of the curved portion should be just above or slightly outside of the plane established by the wall of the solar cell. As with the bevel edge embodiment, there is no advantage in redirecting illumination incident on effective area of the coverslide. The finishing point of the curved surface must be such that light striking that point will be directed toward the cell. The finishing point may be calculated in a manner similar to that discussed with respect to FIG. 1b. That is, the end point is positioned where a tangent line to that point would have the correct angle to direct light to the cell. The angle of the tangent line can be derived in a manner similar to that used for a flat bevel surface. Again, the radiation "sees" an expanded area over the solar cell.

Figure 3:
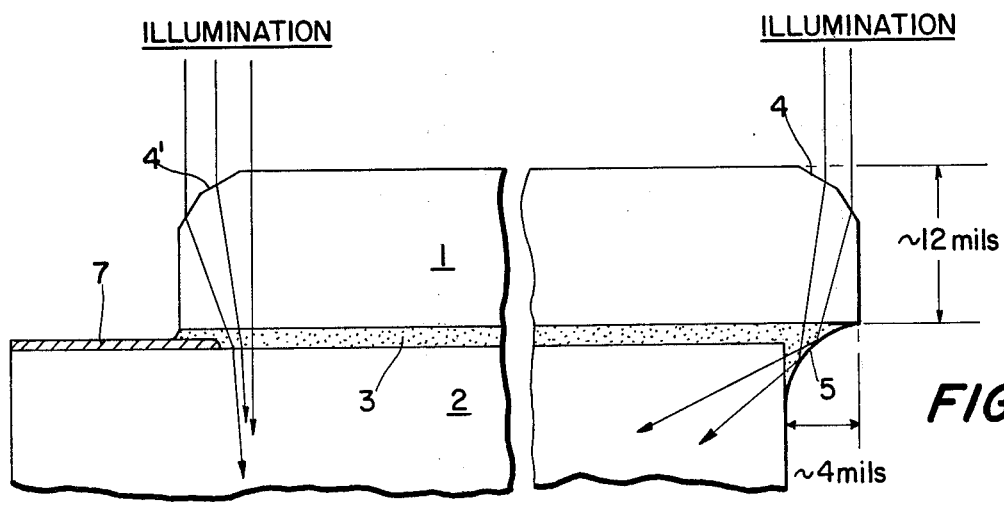
FIG. 3 is a cross-section fragment of a third embodiment showing an oversize coverslide and solar cell assembly wherein the coverslide has a multi-section edge comprised of a plurality of contiguous, bevelled surfaces positioned between the top surface of the coverslide and the side wall of the coverslide.

FIG. 3 shows an embodiment having a multi-angle bevel edge formed by a plurality of contiguous bevelled surfaces. In the Figure a two-section bevel is shown. Again, geometric design and analysis would be conducted in a manner similar to that for FIG. 1b. The multi-angle embodiment might more practical to produce than would the curved edge embodiment. Also shown in FIG. 3 is a portion of a busbar 7 for making electrical connection to the solar cell. For solar cells having thin busbars with enlarged contact pads, the solar cell coverslide may be notched-out over the contact pad area and therefore otherwise extend beyond all of the cell edges. For a typical notched coverslide (12 mils × 798 mils × 798 mils) light collected from the oversize portion would provide an additional two percent of illumination reaching the solar cell. For a conventional cell with a solid busbar along one edge, a coverslide is used which partially overlaps the solar cell busbar, but does not extend to the edge of the cell on that side. Almost the same increase can be achieved here since light which would normally fall on the busbar can be redirected into the active cell area.

Figure 4:
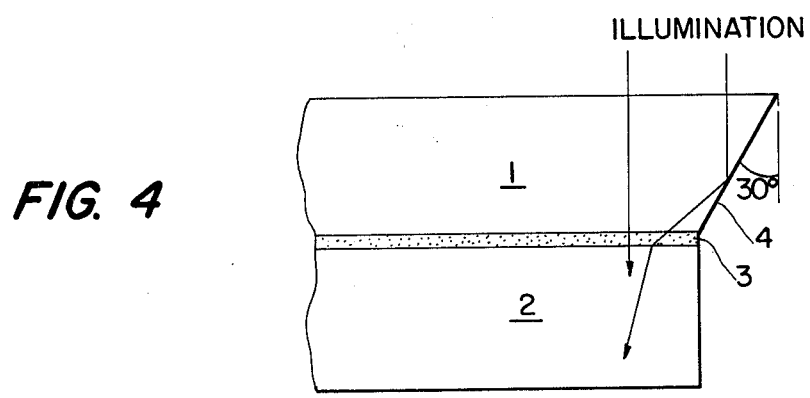
FIG. 4 is a cross-section of a fourth embodiment of an oversize coverslide and solar cell assembly wherein the coverslide has an inwardly bevelled side wall extending from the top surface of the coverslide to the bottom surface of the coverslide.

FIG. 4 shows an oversized coverslide with the edge bevelled inwardly from the upper surface. Light striking the edge 4 is directed inwardly by total internal reflection rather than by refraction as in FIG. 1a. To reflect light into the cell, the lower edge bevel must be at angle of less than 45% and an angle of 30% with respect to the incident light would probably be optimum. This embodiment would be more efficient in terms of light transfer into the cell but would not provide as much protection for the solar cell from isotropic protons in space.

I claim:

1. A solar cell having an overlying transparent coverslide, said coverslide having at least a length or width greater than a corresponding dimension of said solar cell such that a portion of said coverslide overhangs said solar cell and further characterized by an edge portion of said overhanging portion confirgured such that light perpendicular and incident upon said edge portion is directed toward the solar cell.

2. The solar cell of claim 1 wherein said edge portion of said coverslide is shaped to have a simple bevelled edge.

3. The solar cell of claim 1 wherein said edge portion of said coverslide is shaped to have a plurality of contiguous bevelled surfaces.

4. The solar cell of claim 1 wherein said edge portion of said coverslide is shaped to have a curved edge.

5. A solar cell having an oversized coverslide in overlying relationship with the light incident surface thereof, said coverslide being sized to overhang at least two edges of said light incident surface and having on said overhanging portion an optically shaped edge to direct light normal to a top surface of said coverslide and incident on said shaped edge portion inwardly toward said solar cell.

6. The solar cell of claim 5 further comprising a fillet formed of light transmitting adhesive material formed between the lower surface of the coverslide and the top edge of the solar cell such that light incident on a lower region of said shaped edge is optically coupled through said fillet and into the solar cell.

* * * * *